(12) United States Patent
Mitchell

(10) Patent No.: US 12,314,137 B2
(45) Date of Patent: *May 27, 2025

(54) AUTOSCREENSHOT SYSTEMS AND METHODS FOR VIRTUAL OPERATING SYSTEM STATES

(71) Applicant: KASEYA US LLC, Miami, FL (US)

(72) Inventor: Collin Mitchell, Rochester, NY (US)

(73) Assignee: KASEYA US LLC, Miami, FL (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/438,150

(22) Filed: Feb. 9, 2024

(65) Prior Publication Data
US 2024/0184673 A1 Jun. 6, 2024

Related U.S. Application Data

(63) Continuation of application No. 17/366,568, filed on Jul. 2, 2021, now Pat. No. 11,899,536.

(51) Int. Cl.
| | | |
|---|---|---|
| *G06F 11/00* | (2006.01) | |
| *G06F 9/4401* | (2018.01) | |
| *G06F 9/455* | (2018.01) | |
| *G06F 11/14* | (2006.01) | |
| *G06N 3/04* | (2023.01) | |
| *G11C 29/08* | (2006.01) | |

(52) U.S. Cl.
CPC ........ *G06F 11/1448* (2013.01); *G06F 9/4401* (2013.01); *G06F 9/45558* (2013.01); *G06N 3/04* (2013.01); *G11C 29/08* (2013.01); *G06F 2009/45575* (2013.01)

(58) Field of Classification Search
CPC .................................................. G06F 11/1448
USPC ....................................................... 714/1–57
See application file for complete search history.

(56) References Cited

U.S. PATENT DOCUMENTS

| | | |
|---|---|---|
| 8,762,881 B2 | 6/2014 | Lawrance |
| 9,053,126 B2 | 6/2015 | Uamada |
| 9,251,435 B2 | 2/2016 | Danko |
| 9,323,638 B2 | 4/2016 | Coleman et al. |
| 9,424,481 B2 | 8/2016 | Danko |
| 9,836,347 B2 | 12/2017 | McChord et al. |
| 10,387,889 B1 | 8/2019 | Hanna et al. |
| 10,423,657 B2 | 9/2019 | Pearlman et al. |
| 10,684,910 B2 | 7/2020 | McChord et al. |

(Continued)

OTHER PUBLICATIONS

International Search Report and Written Opinion for International Application No. PCT/US2021/065438 mailed Apr. 25, 2022, 16 pgs.

*Primary Examiner* — Sarai E Butler
(74) *Attorney, Agent, or Firm* — MASCHOFF BRENNAN

(57) ABSTRACT

Described screenshot verification systems and methods for automatically verifying the integrity of a backup image or other process-of-interest using a screenshot verification system, as well as disaster recovery systems including said systems and performing said methods. In accordance with various aspects of the present disclosure, a virtual machine is booted and screenshots of the boot process are taken, which are used by a trained model, such as a convolutional neural network, to determine a boot state consistency. The systems and methods described deliver over 99% accuracy and do not involve regular expression analysis typical of conventional methods.

20 Claims, 11 Drawing Sheets

(56) References Cited

U.S. PATENT DOCUMENTS

| | | |
|---|---|---|
| 10,705,939 B2 | 7/2020 | McChord et al. |
| 10,754,753 B1 | 8/2020 | Cogley et al. |
| 10,983,877 B1 | 4/2021 | Hoffman et al. |
| 2004/0153822 A1* | 8/2004 | Arcand .......... G01R 31/318314 714/38.14 |
| 2005/0223274 A1 | 10/2005 | Bernick et al. |
| 2006/0106743 A1 | 5/2006 | Horvitz |
| 2008/0016387 A1 | 1/2008 | Bensinger |
| 2012/0102373 A1* | 4/2012 | Waugh ................ G06F 11/0778 714/57 |
| 2015/0161008 A1* | 6/2015 | Antony ............... G06F 11/1415 714/16 |
| 2016/0048438 A1 | 2/2016 | Martos et al. |
| 2016/0335555 A1* | 11/2016 | Llanes-Tosar ...... G06F 11/0778 |
| 2018/0101425 A1 | 4/2018 | McChord et al. |
| 2020/0050762 A1 | 2/2020 | Sathyanarayana et al. |
| 2020/0151345 A1 | 5/2020 | Chauhan |
| 2020/0257587 A1 | 8/2020 | Chau et al. |
| 2021/0081294 A1* | 3/2021 | Golubev ................ G06F 18/214 |
| 2021/0165708 A1* | 6/2021 | Vijayaraghavan ....... G06N 3/04 |

\* cited by examiner

AUTOSCREENSHOT SYSTEMS AND METHODS FOR VIRTUAL OPERATING SYSTEM STATES

CROSS-REFERENCE TO RELATED APPLICATIONS

This application is a continuation of U.S. patent application Ser. No. 17/366,568, filed on Jul. 2, 2021; the disclosure of which is incorporated herein by reference in its entirety.

BACKGROUND

The following innovations generally relate to automated screenshot verification systems and methods for verifying virtual operating system states. Screenshot verification technologies allow for the confirmation that a device's backups are healthy and working by building and booting virtual machines from preexisting backups and performing context-sensitive tests against the virtual machine's output to evaluate a pass or fail condition. It finds a particular application in conjunction with robust disaster recovery systems and methods that require highly accurate evaluations but avoids having to extract text from the screenshots of the virtual machine boot states and matching against an ever-increasing and ever-changing list of representations of operating system bootable states.

BRIEF DESCRIPTION

In accordance with a first embodiment of the present disclosure, a method of evaluating the integrity of a process-of-interest associated with a protected machine and performing a recommended action based thereon is described. The method can include: (a) initiating the process-of-interest; (b) taking a plurality of screenshots of the display output while the process-of-interest is being initiated; (c) communicating one or more of the plurality of screenshots of the display output to a prediction module; (d) using the prediction module, determining a state classification for each screenshot of the plurality of screenshots of the display output using a trained model, wherein the trained model is an artificial neural network; (e) adding each screenshot of the plurality of screenshots of the display output and the state classification associated with each screenshot to a memory array; (f) testing at least a first portion of the memory array to determine a consistency class for the process-of-interest based on the screenshots and the associated state classifications stored in at least the first portion of the memory array; (g) based on the consistency class determined based on at least the first portion of the memory array, performing at least one of the following: (g1) repeating steps (b) through (g) and testing at least a second portion of the memory array to determine a consistency class for the process-of-interest based on the screenshots and the associated state classifications stored in at least the second portion of the memory array, and wherein the second portion of the memory array includes one or more screenshots and one or more state classifications not included in the first portion of the memory array; and (g2) generating a report concerning the consistency class determined in connection with at least the first portion of the memory array, the report comprising a representative screenshot selected from the screenshots stored within the memory array and the consistency class.

In accordance with a second embodiment of the present disclosure, a method of evaluating the integrity of at least a first backup image associated with a protected machine and performing a recommended action based thereon is described. The method can include: (a) booting a virtual machine based on at least the first backup image; (b) taking a plurality of samples of the display output of the virtual machine over a first duration; (c) communicating the plurality of samples to a prediction module, the prediction module comprising a trained model; (d) determining, via the trained model of the prediction module, a state classification for one or more samples of the plurality of samples, wherein the trained model is an artificial neural network trained using a plurality of training images from one or more operating systems; (e) adding each sample of the plurality of samples and each associated state classifications to a memory array; (f) testing at least a first portion of the memory array to determine a consistency class based on the samples and the state classifications stored in at least the first portion of the memory array; (g) based on the consistency class determined based on at least the first portion of the memory array, performing at least one of the following: (g1) repeating steps (b) through (g) and testing at least a second portion of the memory array to determine a consistency class based on the samples and state classifications stored in at least the second portion of the memory array, wherein the second portion of the memory array includes one or more samples and one or more state classifications not included in the first portion of the memory array; and (g2) generating a report concerning the consistency class determined in connection with at least the first portion of the memory array, the report comprising a representative screenshot selected from the screenshots stored within the memory array and the consistency class.

In accordance with a third embodiment of the present disclosure, a protected machine backup system is described. The backup system can include at least a first device including at least one processor and memory storing instructions that, when executed by the at least one processor, cause the first device to perform one or more steps. These steps may include: (a) booting a virtual machine based on at least a first backup image; (b) taking a plurality of samples of the display output of the virtual machine over a first duration while the virtual machine is booting; (c) communicating the plurality of samples of the virtual machine to a prediction module comprising a trained model, wherein the trained model is an artificial neural network trained using a plurality of boot-state training images from one or more operating systems; (d) determining, via the prediction model, a state classification for each sample of the plurality of samples of the virtual machine; (e) adding each sample of the plurality of samples of the virtual machine and the state classification determined in association with each sample to a memory array; (f) testing at least a first portion of the memory array to determine a consistency class based on the samples and the state classifications stored in at least the first portion of the memory array; and (g) based on the consistency class determined based on at least the first portion of the memory array, performing at least one of the following: (g1) repeating steps (b) through (g) and testing at least a second portion of the memory array to determine a consistency class based on the samples and state classifications stored in at least the second portion of the memory array, wherein the second portion of the memory array includes one or more samples and one or more state classifications not included in the first portion of the memory array; (g2) generating a report concerning the consistency class determined in connection with at least the first portion of the memory array, the report comprising a representative screenshot selected from the screenshots stored within the memory array and the consistency class; and (g3) generating a recommended action to be taken based on the consistency class and taking the recommended action, wherein the recommended action including at least one of: reporting information regarding the consistency class; recording information regarding the consistency class; and ending the method.

In accordance with a fourth embodiment of the present disclosure, a screenshot verification system for evaluating the integrity of a process-of-interest is described. The system can include at least a first device comprising at least one processor and memory including instructions that, when executed by the at least one processor, cause the first device to perform one or more steps. (a) initializing the process-of-interest; (b) taking a plurality of screenshots of the display output associated with the process-of-interest over a first duration including the initialization of the process-of-interest; (c) communicating the plurality of screenshots of the display output associated with the process-of-interest to a prediction module, wherein the prediction comprises a trained model that is an artificial neural network trained using a plurality of process-of-interest training images from one or more operating systems; (d) determining, via the prediction module, a state classification for each screenshot of the plurality of screenshots of the display output associated with the process-of-interest; (e) adding each screenshot of the plurality of screenshots of the display output and the state classifications determined in association with each screenshot to a memory array; (f) testing at least a first portion of the memory array to determine a consistency class for the process-of-interest based on the screen-shots and the associated state classifications stored in at least the first portion of the memory array; (g) based on the consistency class determined based on at least the first portion of the memory array, performing at least one of the following: (g1) repeating steps (b) through (g) and testing at least a second portion of the memory array to determine a consistency class for the process-of-interest based on the screenshots and the associated state classifications stored in at least the second portion of the memory array, and wherein the second portion of the memory array includes one or more screenshots and one or more state classifications not included in the first portion of the memory array; (g2) generating a report concerning the consistency class determined in connection with at least the first portion of the memory array, the report comprising a representative screenshot selected from the screenshots stored within the memory array and the consistency class; and (g3) generating a recommended action to be taken based on the consistency class and taking the recommended action, wherein the recommended action including at least one of: reporting information regarding the consistency class; recording information regarding the consistency class; and ending the method.

BRIEF DESCRIPTION OF THE DRAWINGS

For a more complete understanding of the present disclosure, reference is now made to the following descriptions taken in conjunction with the accompanying drawings, in which.

DETAILED DESCRIPTION

Figure 1:
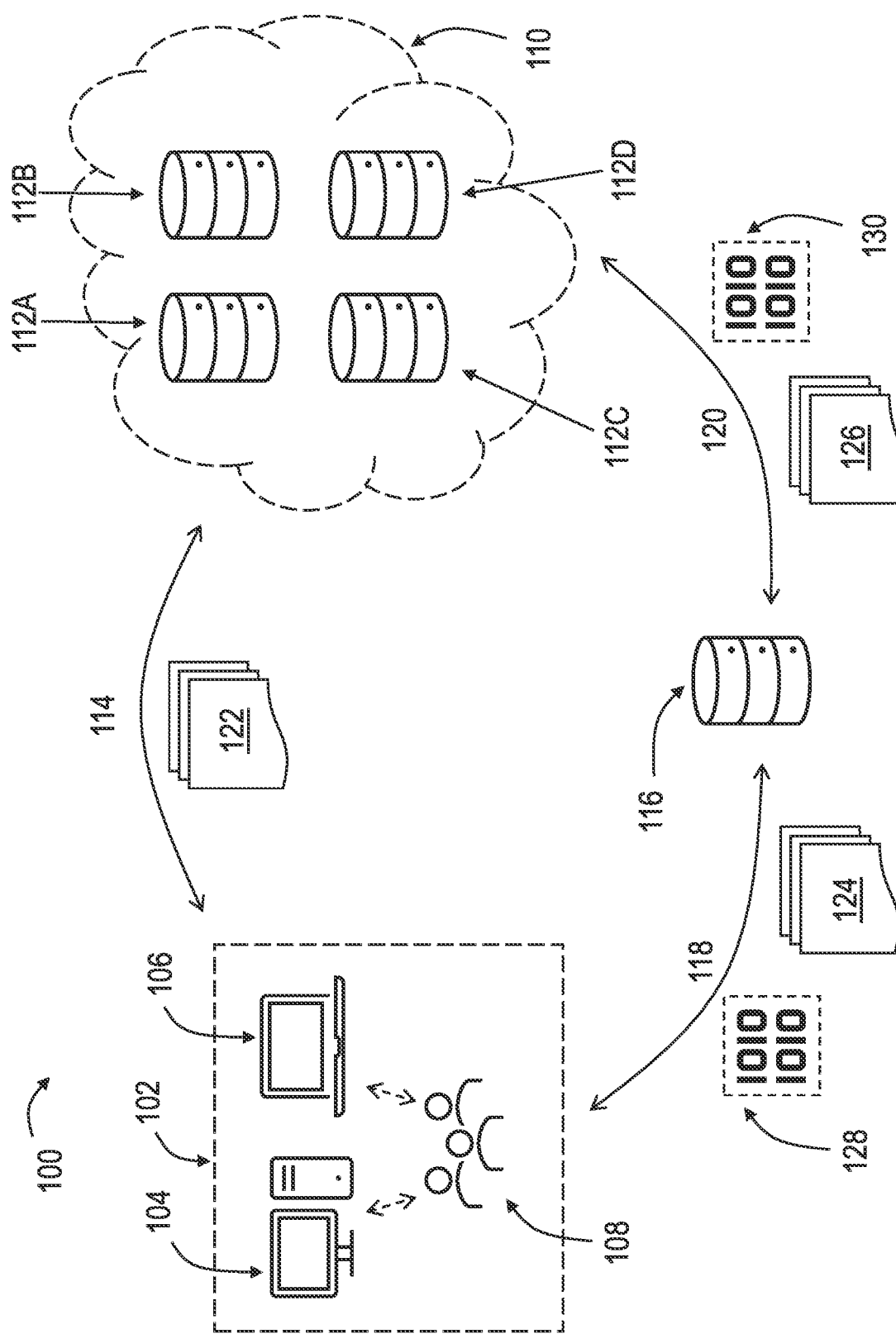
FIG. 1 is a block diagram of a backup system including a screenshot verification system illustrated in accordance with one aspect of the present disclosure.

As used herein, the terms "screenshot" and "screenshot image" are used to refer to a copy of the output displayed by a computer screen.

As used herein, the term "disk image" is used to refer to a computer file containing the contents of a disk volume such as a hard disk, an optical disc, a USB flash drive, or other storage media. A "backup disk image" refers to a disk image that is a copy of a disk volume that is stored for backup purposes.

The present disclosure is directed towards automated screenshot verification systems and methods for verifying operating system states. Robust disaster recovery systems and methods require accurate evaluation of backup disk images. In particular scenarios, it may be important to determine the integrity of a backup image. One method of performing such determinations is by using a device's backup image to boot a virtual machine and then take a screenshot of the boot state of the virtual machine for confirmation. In other scenarios, it may be important to determine the integrity of a process or subprocess (i.e., a process-of-interest) associated with a device and/or its backup disk image. For example, a device may be booted and instructed to perform a particular process (e.g., program, application, etc.) while screenshots of the display output are taken. However, the ways that various programs, applications, and the like are displayed by different operating systems can change with every update. As such, there is very little consistency guaranteed when attempting to check the integrity of boot states and/or process states across a wide range of platforms using conventional text extraction methods. Similarly, the ways that boot states are displayed by various operating systems are ever-increasing and ever-changing.

Screenshot verification technologies allow for the confirmation of the integrity of a computer state by building and booting virtual machines from preexisting backups and performing context-sensitive tests against the virtual machine's output to evaluate a pass or fail condition. In existing processes, it is challenging to include new categories of machine states, and categorization using regular expressions (also known as regex) is error prone. Categorization using regular expressions extracted from an image is reliant on two phases: a text extraction phase and a matching phase. While character recognition has improved, these systems and methods are dependent on the library correctly identifying all characters in any possible image that it encounters. In a global context, this is a much harder to guarantee and a single mistake can break the "model" that is being built. Other languages outside the United States and Europe also have the issue of being correctly translated, as different dialects can use different characters to mean similar ideas, which further expands the complexity of building the regex translation model. With regular expressions, the mapping needs to be built manually for every single case and regex logical errors can mean that incorrect predictions become difficult to track down; a single mistaken metacharacter could fail a subset of the "classes" built into the model and requires someone familiar with regex to search tens of thousands of possible matches. Thus, it would be desirable to have systems and methods for determining and/or evaluating the integrity of a device's backup image and/or a process state associated with a device or a device's backup image that avoid having to extract text from the screenshots of display output associated with the state of interest and matching against the ever-increasing and ever-changing list of representations of bootable/process states.

In accordance with various embodiments of the present disclosure, systems and methods for evaluating the integrity of a backup image and/or process associated with a device or a device's backup image are described that employ an artificial intelligence model, such as a convolutional neural network ("CNN"), which may be trained with various classes of images produced by an operating system that indicate the boot/process state. Unlike regex, retraining using a CNN does not have the same overhead concerns. Thus, correcting failures or accounting for additional screenshot image classes can be a matter of collecting additional samples of the failures and/or additional classes, labeling them with the correct category, and then retraining. CNNs can also handle some degree of mislabeled cases and a few mislabeled cases will not fundamentally break the predictions as does regex. This also allows users to remove the Text Extraction Phase entirely and use the screenshot image data which contains more information aside from just text. This gain in information can further allow users to move towards more complex decision making.

In accordance with a first embodiment of the present disclosure, described are methods of evaluating the integrity of a state of an associated device by verifying one or more screenshot images taken of the display output associated with the device's state. The associated device can be, for example and without limitation, a physical machine or a virtual machine. Examples of physical machines include, without limitation, a desktop computer, a laptop computer, a tablet, a mobile device, a cellphone, a server, and the like. In cases where the device is a virtual machine, the virtual machine can be run based on a backup disk image of a protected physical machine. As used herein, the terms "protected physical machine" and "protected machine" refer to a machine, whether virtual or physical, that is protected using a disaster recovery/backup system. In certain embodiments, the device further includes a user display, such as a monitor, screen, touchscreen, and the like, which is used by the device's operating system to display output from a program or the operating system running on the device.

In a first step, the method comprises initiating a process or routine using the associated device. In some embodiments, initiating the process or routine may involve starting or running a program/application (e.g., Microsoft® Word, etc.). In other embodiments, the process or routine may be booting an operating system (e.g., Windows, Linux, MacOS, etc.) of the associated device. In either case, the associated device may be operated based on the machine's physical disk or based on a backup image of a protected machine.

In a second step, the method comprises taking one or more screenshots of the display output of the associated device over a period of time. In particular embodiments, the one or more screenshots of the display output are taken when the associated device reaches a state that may be of interest. For example, if the integrity of the bootable state of the associated device is of interest, then the operating system managing the associated device is instructed, via one or more processors, to capture the display output as the associated device reaches a boot screen. In other embodiments, if the integrity of a program/application state is of interest, then the operating system managing the associated device is instructed, via one or more processors, to capture the display output as the associated device reaches, for example, a start-up screen for that program. In more specific examples, one or more screenshots may be taken for verification purposes as the program/application opens a particular reference file or visits a particular website.

In accordance with certain aspects of the present disclosure, it is contemplated that at least the first and the second steps of the described methods occur at the protected machine. However, it is also contemplated that at least the first and the second steps of the described methods occur at a location remote to the protected machine. For example, the associated device may include a backup disk image of the protected machine that is being stored on a remote server and that is used to run a virtualization of the protected machine based on the backup disk image.

In a third step, the method comprises determining a state classification for each of the screenshots based on at least one determined attribute associated with the screenshot. The determined attributes associated with each of the one or more screenshots can include information about whether the associated device reached a desirable process/bootable state. For example, and without limitation, the determined attributes may indicate whether the screenshot is primarily one color (e.g., blue, etc.) or contains a plurality of colors, whether the screenshot contains certain features associated with a landscape, animals, and/or people, whether the screenshot contains certain text, or whether the screenshot does or does not show an input text box. In further embodiments, the determined attributes do not include information about the text contained in the screenshot and/or does not involve recognizing text contained within the screenshot. In preferred embodiments, the at least one attribute associated with the screenshots is determined by communicating the screenshots to a trained model for automated analysis based on a predefined set of rules. In specific embodiments, the trained model determines a state classification for one or more of the plurality of screenshots based on at least the determined attributes. In further embodiments, other information may be used in addition to the screenshots to determine the state classifications, including but not limited to register values. As used herein, the term "state classification" refers to the output of a prediction module (e.g., running a trained model such as a CNN) and represents the probabilistic determination of whether the screenshot—which shows the process-of-interest/bootable state of the associated device—reached a certain state. As discussed herein, the state classification can be based on one or more attributes determined in association with one or more of the screenshots.

In preferred embodiments, the trained model may be an artificial neural network such as a convolutional neural network. The trained model receives the one or more screenshot images and passes each screenshot through a plurality of layers to obtain an output. The output can be, for example, a state classification based on one or more determined attributes associated with the screenshot, such as a determination of whether the screenshot image shows a desirable program/boot state and/or the probability of whether the screenshot image shows a desirable program/boot state. In particular embodiments, the plurality of layers includes one or more convolutional layers, one or more rectified linear unit layers, one or more pooling (or sub-sampling) layers, and a fully-connected (or output) layer.

One or more programming languages and libraries may be used in order to deploy the trained model and implement one or more of the analytical layers. For example, the trained model may be coded in at least Python and use one or more features of the PyTorch library. PyTorch is an open-source machine learning library that is optimized for applications including, among other things, computer vision.

As used herein, a convolutional layer or convolution transformation refers to a linear filtering operation that involves the multiplication of a set of weights with an array of input data and a two-dimensional array of weights, called a kernel. In accordance with the present disclosure, the input data may be one or more screenshots of the display output associated with a process-of-interest and/or a boot-screen of a virtual machine. The kernel is preferably smaller than the input data and the type of multiplication applied between a kernel-sized patch of the input and the kernel is a dot product, which results in a single value. By using a kernel smaller than the input, the same kernel (i.e., set of weights) can be multiplied by the input array multiple times at different points on the input. Specifically, the kernel may be applied systematically to each overlapping part or kernel-sized patch of the input data (e.g., left to right, top to bottom). As the filter is applied repeatedly to the input array, the result is a "feature map", two-dimensional array of output values that represent a filtering of the input.

In certain embodiments, one or more of the convolutional layers may be a two-dimensional convolutional layer, wherein a two-dimensional convolution is applied over an input signal (i.e., one or more screenshot of the display output) of several input planes. For example, if using PyTorch, the torch.nn.Conv2d generates an output values of the layer with input size (N, $C_{in}$, $H_{in}$, $W_{in}$) and output (N, $C_{out}$, $H_{out}$, $W_{out}$) according to the following equation:

$$\text{out}(N_i, C_{out_j}) = \text{bias}(C_{out_j}) + \sum_{k=0}^{C_{in}-1} \text{weight}(C_{out_j}, k) * \text{input}(N_i, k)$$

wherein * is a cross-correlation operation (also known as a sliding dot product or sliding inner-product), N is a batch size (number of images), $N_i$ indexes the ith image, $C_{in}$ refers to the number of input image channels, $C_{in_i}$ can be used to index the ith input channel (e.g., $C_{in}$ may be 3 and $C_{in_j}$ may have values 1, 2, 3, for an image with red, green and blue channels such as those shown in FIGS. 5-9), $C_{out}$ refers to the number of output channels and may be the same as $C_{in}$ or it may differ, similarly $C_{out_j}$ indexes the jth output channels), $H_{in}$ is the height of the input planes in pixels, and $W_{in}$ is the width of the input planes in pixels, $H_{out}$ is the height of the output planes in pixels, and $W_{out}$ is the width of the output planes in pixels, k is a multiplier that is a positive integer, weight is the learnable weights of a pre-determined and/or variable size, and "bias" is the learnable bias of a pre-determined and/or variable size.

Once a feature map is created, each value in the feature map may be passed through a rectification layer, such as a ReLU, which is a piecewise linear function that outputs the input directly if it is positive, or zero otherwise. In particular embodiments, the rectification layer(s) may be a linear or a nonlinear rectification layer.

An additional layer that may be implemented after applying a convolutional layer and/or ReLU includes a pooling-type layer, wherein the input data (e.g., screenshots) is down sampled in order to account for movements in the position of the features identified in the features map, movements due to cropping, rotation, shifting, and/or other changes to the input image. In particular embodiments, the pooling layer operates on each feature map separately to create a new set of the same number of pooled feature maps. More specifically, a pooling operation is applied wherein a filter that is smaller than the size of the input image is applied to the input image. For example, the pooling layer may apply a 2-pixels by 2-pixels filter with a stride of 2 pixels, which would reduce each dimension of the feature map by a factor of 2 (i.e., reducing the number of pixels in each feature map to one quarter the size). In some embodiments, an average pooling layer is applied wherein the average value for each window viewed by the filter is calculated. In other embodiments, a max pooling layer is applied wherein the maximum value for each window by the filter is calculated.

Still another operation that may be applied during this process is referred to herein as a batch normalization. Batch normalization standardizes the activations of each input variable per a subset of input data. In particular embodiments, the batch normalization may be implemented by calculating the mean and the standard deviation of each input variable to a layer per subset of input data and using those statistics to perform a standardization. In other embodiments, a moving average and standard deviation may be used. In specific embodiments, the PyTorch library functions torch. nn. BatchNorm2d and/or torch. nn. BatchNorm 1d may be used.

In accordance with specific embodiments of the present disclosure, the third step can include performing: (i) a first set of processes on an input image or multiple input images, the processes comprising two-dimensional convolution, two-dimensional batch normalization, two-dimensional max pooling, linear rectification, or combinations thereof, to obtain a first output; (ii) a second set of processes on the first output, the processes comprising two-dimensional convolution, two-dimensional batch normalization, linear rectification, or combinations thereof, to obtain a second output; (iii) a third set of processes on the second output, the processes two-dimensional convolution, two-dimensional batch normalization, linear rectification, or combinations thereof, to obtain a third output; (iv) a fourth set of processes on the third output, the processes comprising two-dimensional convolution, two-dimensional batch normalization, linear rectification, or combinations thereof, to obtain a fourth output; (v) a fifth set of processes on the fourth output, the processes comprising two-dimensional adaptive average pooling, two-dimensional adaptive max pooling, flattening, one-dimensional batch normalization, dropout, or combinations thereof, to obtain a fifth output; (vi) a sixth set of processes on the fifth output, the processes comprising linear transformation, linear rectification, one-dimensional batch normalization, dropout, or combinations thereof to obtain a sixth output; and (vii) a seventh set of processes on the sixth output, the processes comprising at least one linear transformation to obtain a seventh output. Based on the output of one or more of the set of processes described herein, an attribute may be determined in association with the original input image(s), which can be used to identify or make a state classification.

In accordance with specific embodiments of the present disclosure, a Residual Network or "Resnet" model may be employed, such as a Resnet34 model. In such models, a residual module is implemented that includes of a block of two convolutional layers with the same number of filters and a small filter size where the output of the second layer is added with the input to the first convolutional layer. However, the initial pre-trained weights (e.g., ImageNet weights) are not included and/or are discarded.

In a fourth step, each screenshot and every state classification based on the one or more attributes determined in association with each screenshot is added to a memory array and tested for a consistency class. In other words, the screenshot and state classifications are stored in a memory and continually checked to determine whether the associated device has reached a consistent state (i.e., a steady state over a particular period of time).

In particular embodiments, the consistency class can be at least one of the following: consistent positive; consistent negative; consistent neutral; or consistent informational. In some embodiments, the consistent positive classification may be determined based on one or more attributes that indicate that the program or boot state of interest was successful (i.e., the program/operating system was executed successfully). On the other hand, the consistent negative classification may be determined based on one or more attributes that indicate that the program or boot state of interest failed to execute properly. In further embodiments, other consistency classes may be determined based on a variety of attributes, such as a neutral classification and/or an informational classification. As used herein, the one or more determined attributes may prompt a "neutral" classification, which would indicate that the program or boot process was neither definitively successful nor definitively unsuccessful. Further, one or more determined attributes may prompt an "informational" classification, which could indicate a state that contains information for further examination (e.g., a dialog box requesting information from a user or informing the user of a particular problem).

If the consistency class indicates that a consistent state has not been reached, then the method optionally repeats steps two through four until a consistent consistency class is determined or until another predetermined exit condition is fulfilled (e.g., the process has repeated for a predetermined amount of time without reaching a consistent state). If it is determined that the associated device has reached a consistent state or another predetermined exit condition is reached, then the method may proceed to a fifth step.

In the fifth step, the method comprises determining an action to be taken based on the consistency class determined in association with plurality of screenshots. In particular embodiments, the action to be taken can include: (1) reporting information regarding the consistent state; (2) recording information regarding the consistent state; (3) ending the method; and/or (4) repeating steps two through five a plurality of times.

In a sixth step, the method comprises performing the action to be taken.

These and other aspects of the present disclosure are described in further detail with reference to FIGS. 1 through 10B.

With reference to FIG. 1, a backup system 100 comprising automated screenshot verification for evaluating the integrity of a backup image is illustrated in accordance with certain aspects of the present disclosure. The backup system 100 can include at least one client site 102 wherein one or more protected machines 104, 106 are used by one or more associated users 108. As used herein, the term "protected machine" refers to any electronic device, such as a server, workstation, desktop, laptop, tablet computer, mobile device, and the like, which are capable of being backed-up. The protected machines 104, 106 of the client site 102 may periodically transfer (depicted at 114) a backup image 122 of the protected machines 104, 106 to a storage server 112A, 112B 112C, 112D in a remote cloud storage center 110.

The backup system 100 can further include a screenshot verification server 116 operatively connected with the protected machines 104, 106 of the client site 102 (depicted as 118), as well as the storage servers 112A, 112B, 112C, 112D of the remote storage center 110 (depicted as 120). In particular embodiments, the screenshot verification server 116 is located remotely from the client 102 and/or the storage center 110. In further embodiments, the screenshot verification server 116 may be located locally to the client site 102 or the remote storage center 110. In still further embodiments, the verification server 116 may be in communication 118, 120 with the devices 104, 106 of more than one client site 102 and/or the devices 112A, 112B, 112C, 112D of more than one storage center 110.

In various embodiments, the verification server 116 may send and/or receive 118 information 124 associated with a backup image of the protected machines 104, 106 to and from the client 102, and may send and/or receive 120 information 126 associated with the backup image(s) of the protected machines 104, 106 to and from the storage center 110. For example, as discussed further below, the verification server 116 may receive samples 124, 126 (e.g., screenshots) of a virtual machine booted at the protected machines 104, 106, and transfer information 128, 130 associated with those samples 124 between the storage center 110 and the protected machines 104, 106.

In particular embodiments, the protected machines 104, 106 include at least one processor and memory including instructions that, when executed by the at least one processor, cause the protected machine 104, 106 to perform one or more steps of the methods disclosed herein. Similarly, the screenshot verification server 116 can also include at least one processor and memory including instructions that, when executed by the at least one processor of the verification server 116, cause the screenshot verification server to perform one or more steps of the methods disclosed herein. The protected machines 104, 106 and the verification server 116 may further include additional components, for example and without limitation, a network interface/protocol (not shown) that facilitates the communication 118, 120 between the various devices 104, 106, 112A, 112B, 112C, 112D of the client site 102 and the storage center 120. In various embodiments, the network communication interface may include, but is not limited to, a local area network, a wide area network, a metropolitan area network, a personal area network, a virtual private network, and the like, whether wired or wireless.

Figure 2:
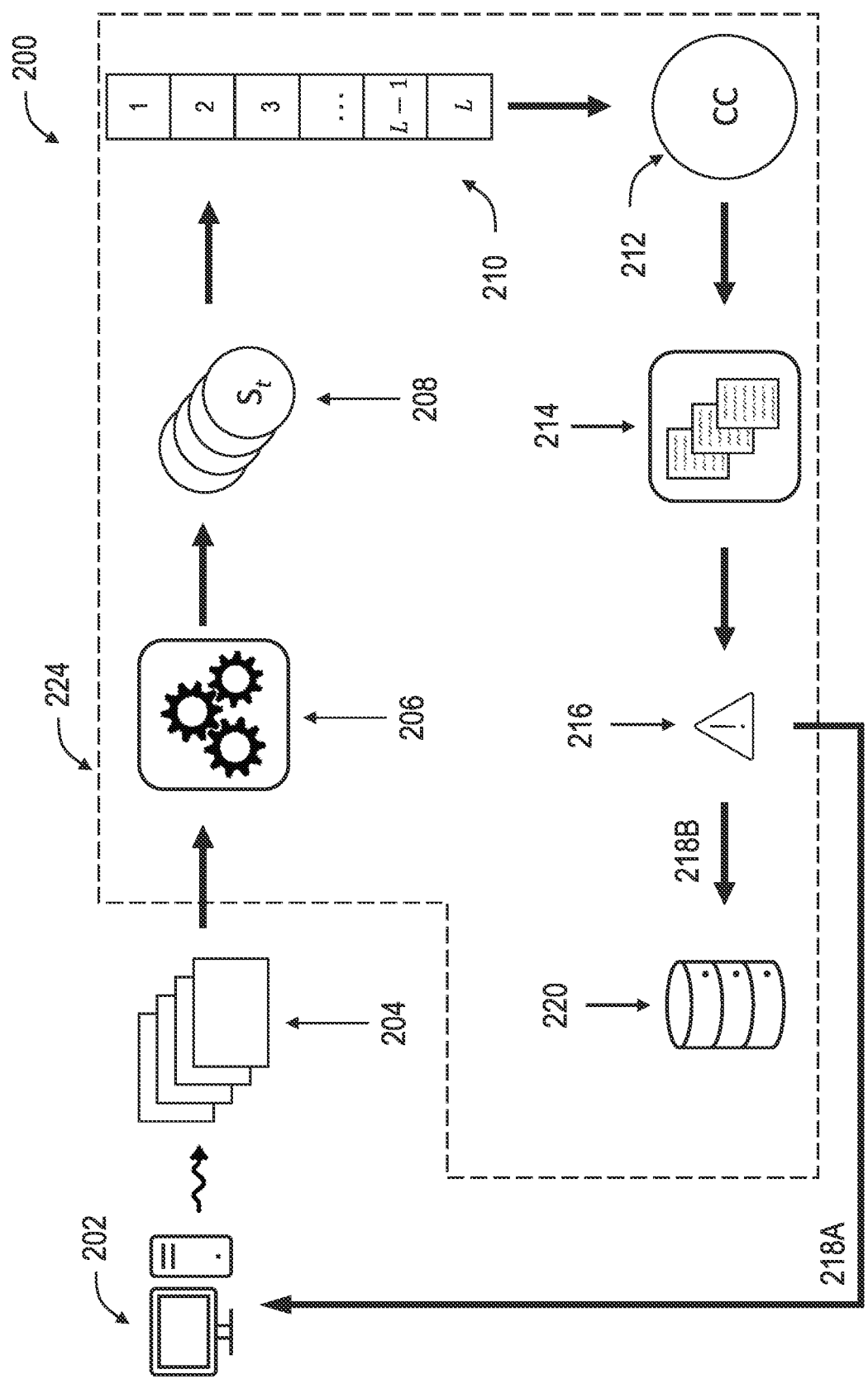
FIG. 2 is a block diagram illustrating the steps of a method for using a screenshot verification system in accordance with one aspect of the present disclosure.

Turning to FIG. 2, a method 200 of utilizing a screenshot verification system and/or backup system 100 in order to evaluate the integrity of a backup image and/or process-of-interest associated with a protected machine 202 is illustrated in accordance with one aspect of the present disclosure. A protected machine 202 as shown in FIG. 2 may be running a boot process and/or a process-of-interest, during which time an operating system managing the protected machine 202 capture one or more screenshots 204 of the display output associated with the boot process and/or process-of-interest. These screenshots 204 are then communicated to a prediction module 206, which receives at least the one or more screenshots 204 as an input.

In particular embodiments, the prediction module 206 determines a state classification for one or more of the screenshots received as input based on at least one determined attribute associated with each screenshot. For example, the prediction module 206 may apply a trained model such as a convolutional neural network to one or more of the screenshots 204, which identifies various attributes associated with each of the screenshots 204 and then determines a state classification 208 about the state of process-of-interest/boot process running on the protected machine 202, as discussed above. In particular, the prediction module 206 receives the one or more screenshot images 204 and passes each screenshot 204 through a plurality of layers to obtain an output, wherein the plurality of layers includes one or more convolutional layers, one or more rectified linear unit layers, one or more pooling (or sub-sampling) layers, and a fully-connected (or output) layer. The prediction module 206 may output one or more state classifications ($S_1$, $S_2$, $S_3$, . . . , $S_t$) 208, wherein each state classification $S_t$ corresponds to one of the screenshots 204 received as input.

Next, each screenshot 204 and corresponding state classification 208 are added to a memory array 210 and tested for a consistency class 212 (i.e., the screenshots 204 and state classifications 208 are stored in a memory and checked to determine whether the associated device 202 has reached a consistent state), as discussed below with respect to FIG. 4. In particular embodiments, the consistency class 212 can be at least one of the following: consistent positive; consistent negative; consistent neutral; or consistent informational. In some embodiments, a consistent positive classification 208 may be determined based on one or more attributes that indicate that the program or boot state of interest was successful (i.e., the program/operating system was executed successfully). On the other hand, a consistent negative classification 208 may be determined based on one or more attributes that indicate that the program or boot state of interest failed to execute properly. In further embodiments, other consistency classes 212 may be determined based on a variety of attributes, such as a neutral state classification 208 and/or an informational stale classification 208. If the consistency class 212 indicates that a consistent state 208 has not been reached, then the process illustrated in FIG. 2 may collect one or more additional screenshots 204 and pass those screenshots 204 through the prediction module 206 until a unique consistency class 212 is determined or until another predetermined exit condition is fulfilled (e.g., the process has repeated for a predetermined amount of time without reaching a consistent state).

If it is determined that the associated device 202 has reached a consistent state or another predetermined exit condition is reached, then the process 200 may then pass at least the consistency class 212 along to an action module 214, which receives at least the consistency class 212 as an input. Using a set of pre-determined rules, the action module 214 then determines a recommended action/an action 216 based on at least the consistency class 212. In particular embodiments, the action to be taken 216 may involve instructing the protected machine 202 (illustrated as 218A) to take the recommended action 216, and/or may involve instructing a remote device 220 (illustrated as 218B) to take the recommended action 216. The recommended action may then be taken by the protected machine 202 and/or the remote device 220. In particular embodiments, the action to be taken can include: (1) reporting information regarding the consistency class 212; (2) recording information regarding the consistency class 212; (3) ending the method by, for example, terminating the process-of-interest/boot process and/or discontinuing the instructions to take and communicate screenshots 204 of the display output; (4) instructing the protected machine 202 to continue taking screenshots 204 and communicating those screenshots to the prediction model 206 for further analysis; (5) updating the trained model of the prediction module 206 with information regarding the consistency class 212, one or more of the state classifications 208, one or more of the determined attributes, and/or one or more of the screenshots 204.

Figure 10A:
FIG. 10A-10B are screenshots of a backup agent associated with a backup system that includes a screenshot verification system in accordance with still another aspect of the present disclosure.
Figure 10B:
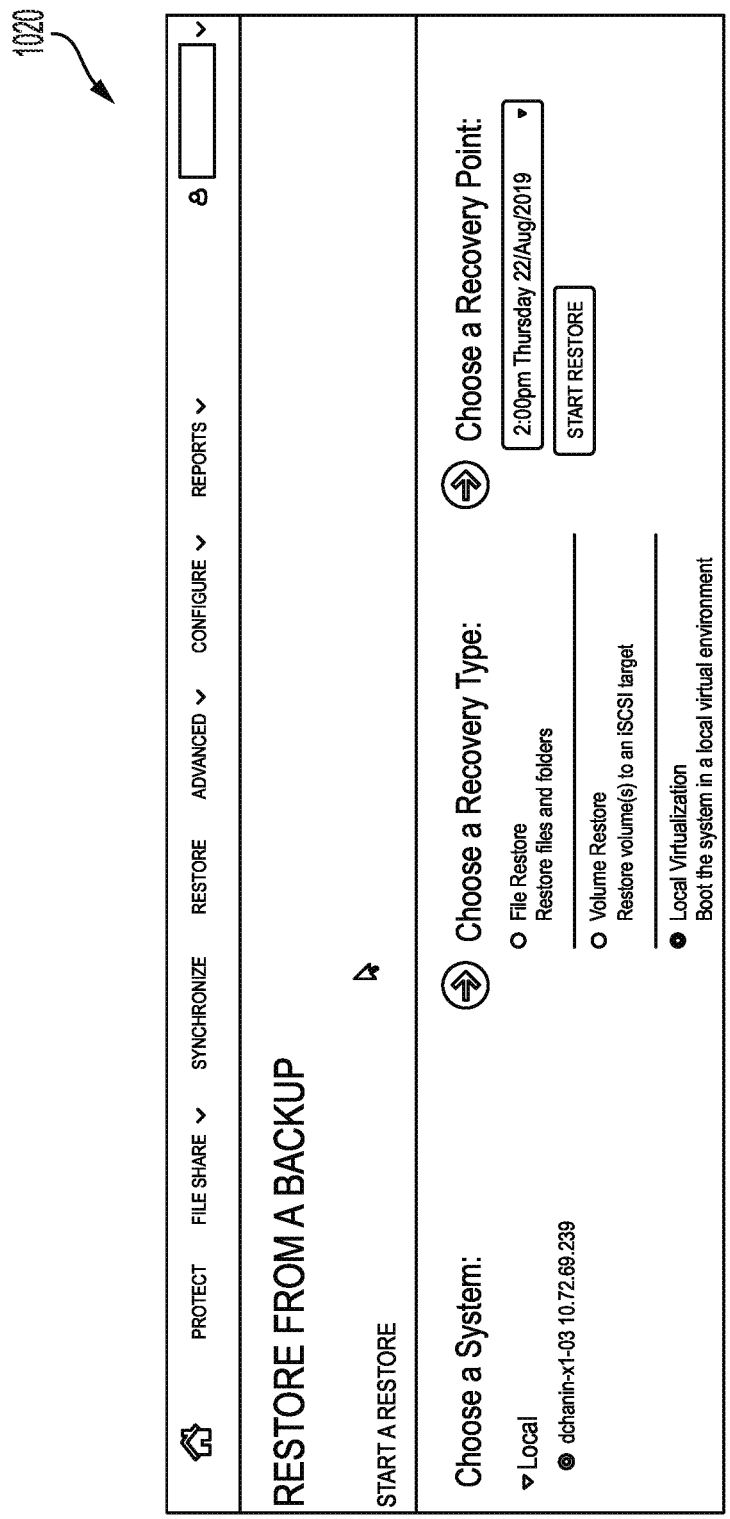

In certain embodiments, the action to be taken may include producing a report concerning the integrity of the process-of-interest/boot process for subsequent review. In some embodiments, producing the report may involve selecting a screenshot from among the plurality of screenshots 204 associated with the determined consistency class 212 and storing the selected screenshot, the consistency class 212, and/or one or more of the determined attributes in a memory (e.g., in a memory on a remote storage server). In such embodiments, this representative information (i.e., information representative of the consistency class 212) may be saved for later review by an associated user (e.g., user 108) and/or a third-party managing the protected machine 202. For example, with reference to FIG. 10A, a backup agent dashboard 1010 is shown that includes a screenshot verification associated with a particular backup image of a protected machine. The backup agent dashboard 1010 further offers the user and/or technician a representative screenshot associated with the determined consistency class that corresponds to that backup image and/or process-of-interest. As a result, the end-user may use the screenshot verification to determine whether to select a particular restore point (as shown in FIG. 10B). However, the screenshot verification can also notify and enable technicians and image backup providers to verify the integrity of one or more backup images, automatically detect potential issues, and provide proactive recommendations and support to users of the protected machines. As described herein, the systems and methods for verifying the integrity of a backup image and/or process-of-interest are at least 99% accurate in determining the correct consistency class.

In further embodiments, the action to be taken may also include performing an incremental and/or full backup of the protected machine 202, or may include restoring the protected machine 202 using an incremental and/or full backup image of the protected machine 202.

As shown in FIG. 2, one or more aspects 224 of the present disclosure may occur at a location (e.g., server, workstation, etc.) remote from the protected machine 202, including but not limited to, receiving the screenshots 204 at the prediction module 206, determining one or more state classifications 208, storing information regarding the state classifications 208 and the associated screenshots 204 in a memory array 210, determining at least one consistency class 212, and determining a recommended action to be taken 216 using an action module 214. However, as discussed in more detail with respect to FIG. 3, the protected machine 202 may be a virtualization of a protected machine, which may also be executed on a remote server.

Figure 3:
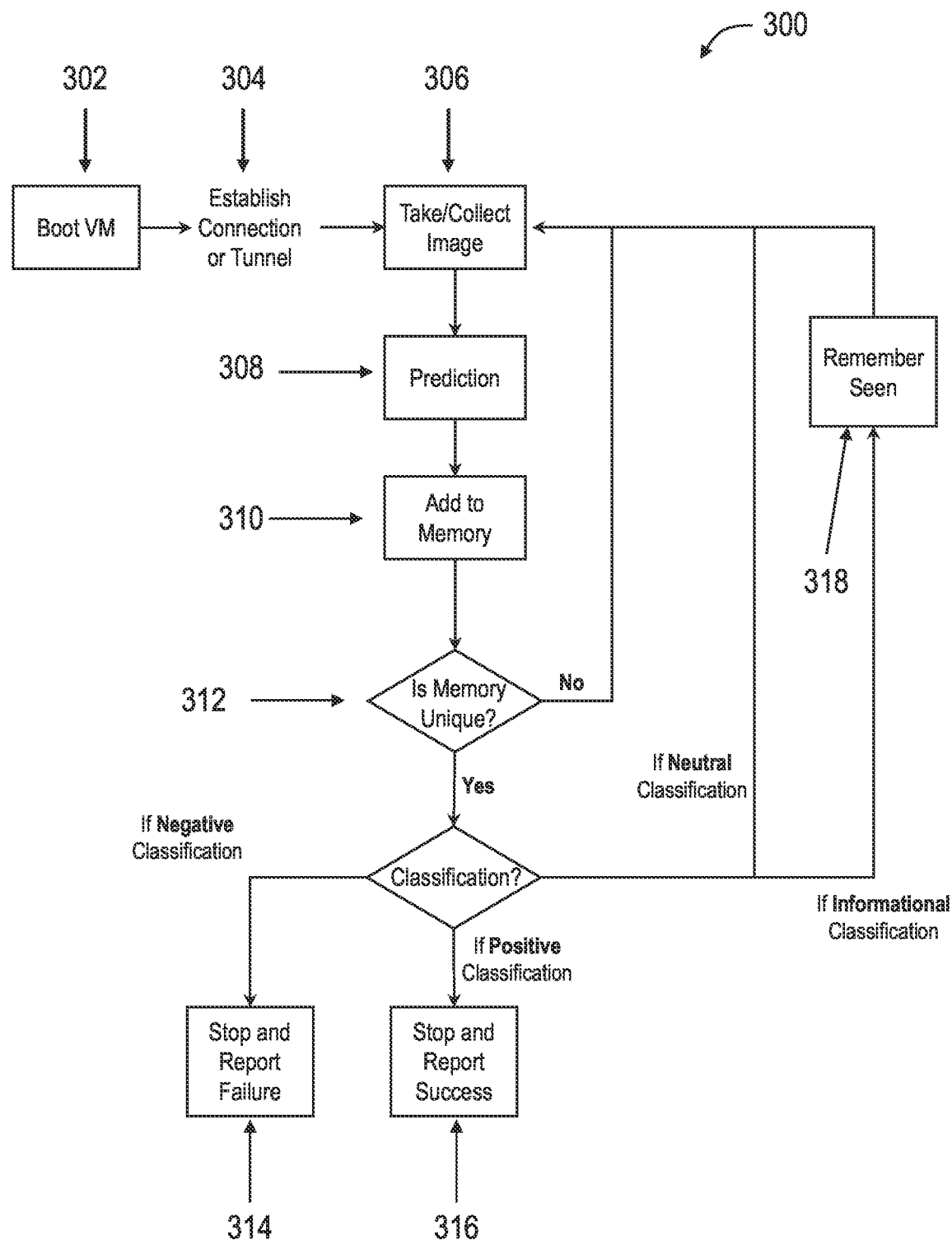
FIG. 3 is a flowchart of a method for verifying the integrity of a backup image in accordance with another aspect of the present disclosure.

Turning now to FIG. 3, methods 300 of utilizing such backup systems 100 and evaluating the integrity of at least a first backup image associated with a protected machine 104, 106 are described in accordance with further aspects of the present disclosure.

In a first step 302, a virtual machine ("VM") of the protected machines 104, 106 is booted based on the first backup image. The virtualization may be performed at any location where the disk images can be mounted and treated as runnable, which can include a number of hypervisor applications. In particular embodiments, the VM may be booted al the client site 102, at a storage center 110, or at a verification server 116 using an operating system managing the device at the respective location. For example, hypervisors can be on or off the Datto SIRIS and include KVM, VMWare, HyperV, Citrix, and the like. In specific embodiments, the methods disclosed herein, including the virtualization, may be performed on a secure backup device, such as a Datto SIRIS device. In other embodiments, the methods may be performed on a remote device or a cluster of remote devices (e.g., remote servers).

In a step 304, the VM can optionally open a connection via any protocol supporting visual formats from VM to verification server 116. Some example possible protocols would be VNC, SPICE, RDP, X, and the like. However, in particular embodiments, this may not be necessary if the method 300 is being performed locally (i.e., on the same network at the protected machine(s)).

In a step 306, using an operating system managing the VM, a plurality of samples of the running virtualization are taken over the duration of powering onto boot at a sample rate ($r_s$). In particular embodiments, each sample of the plurality of samples is a screenshot of the VM during the booting process taken at the sample rate ($r_s$). The sample rate ($r_s$) can about 1 sample per second, but other rates are contemplated (i.e., more than 1 sample per second, less than 1 sample per second, etc.).

Figure 5:
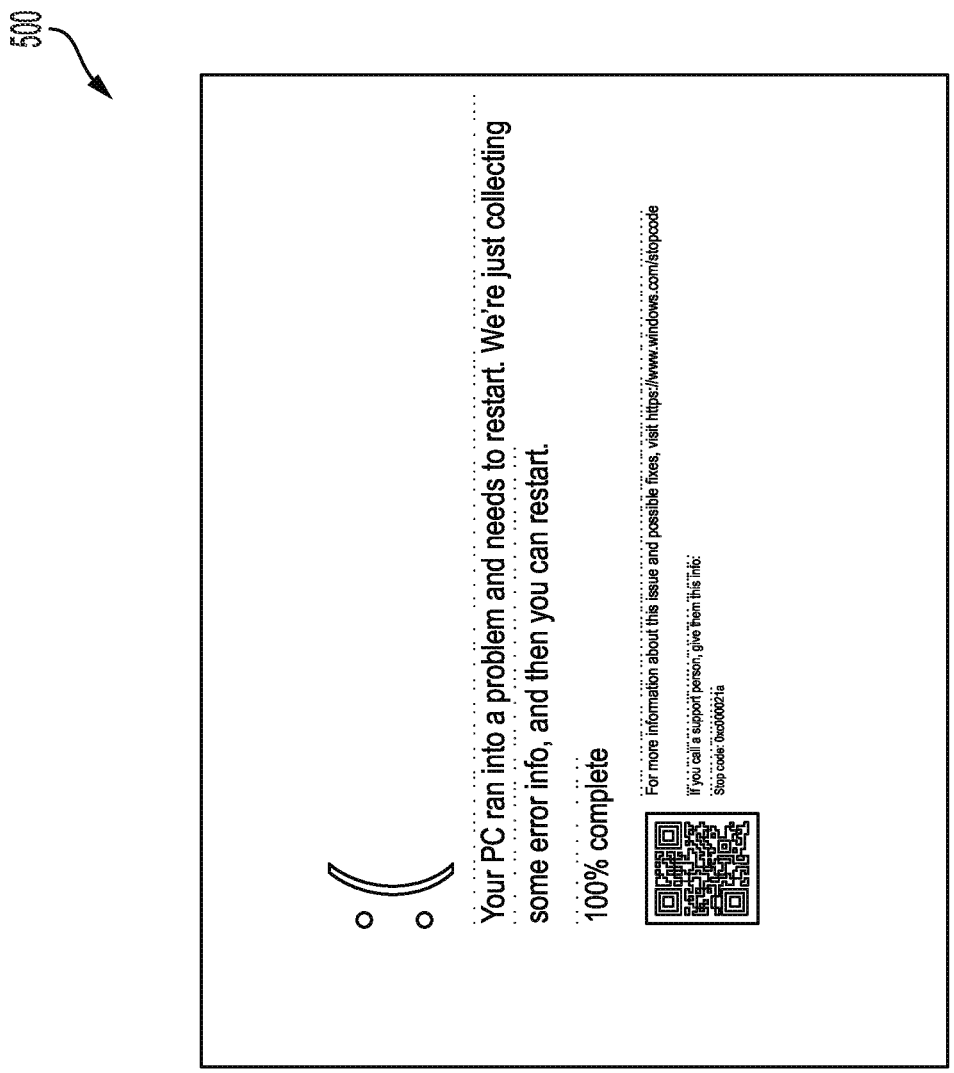
FIGS. 5-9 are screenshots in color of boot screens associated with various boot states of a protected machine running Windows® operating software.
Figure 6:
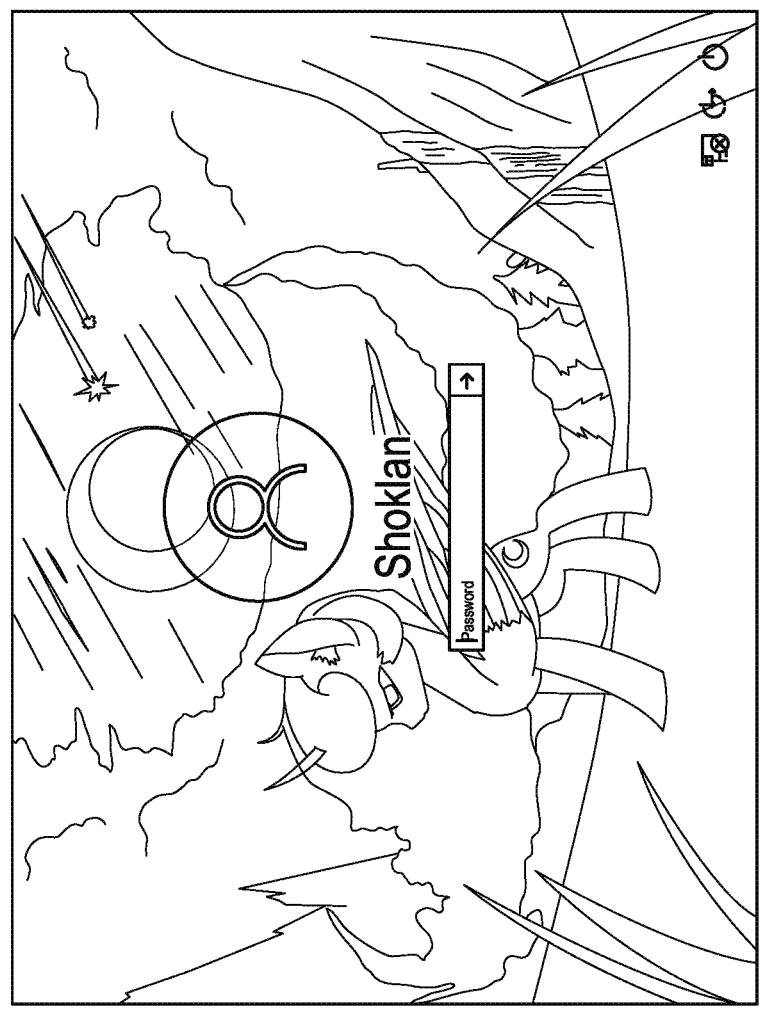
Figure 7:
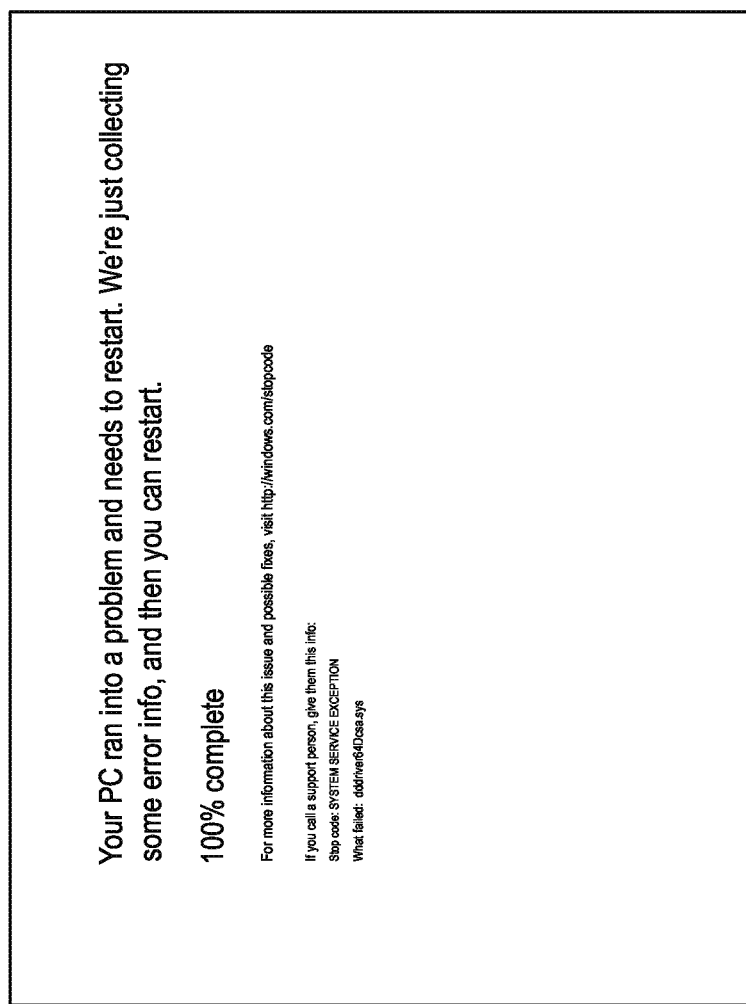
Figure 8:
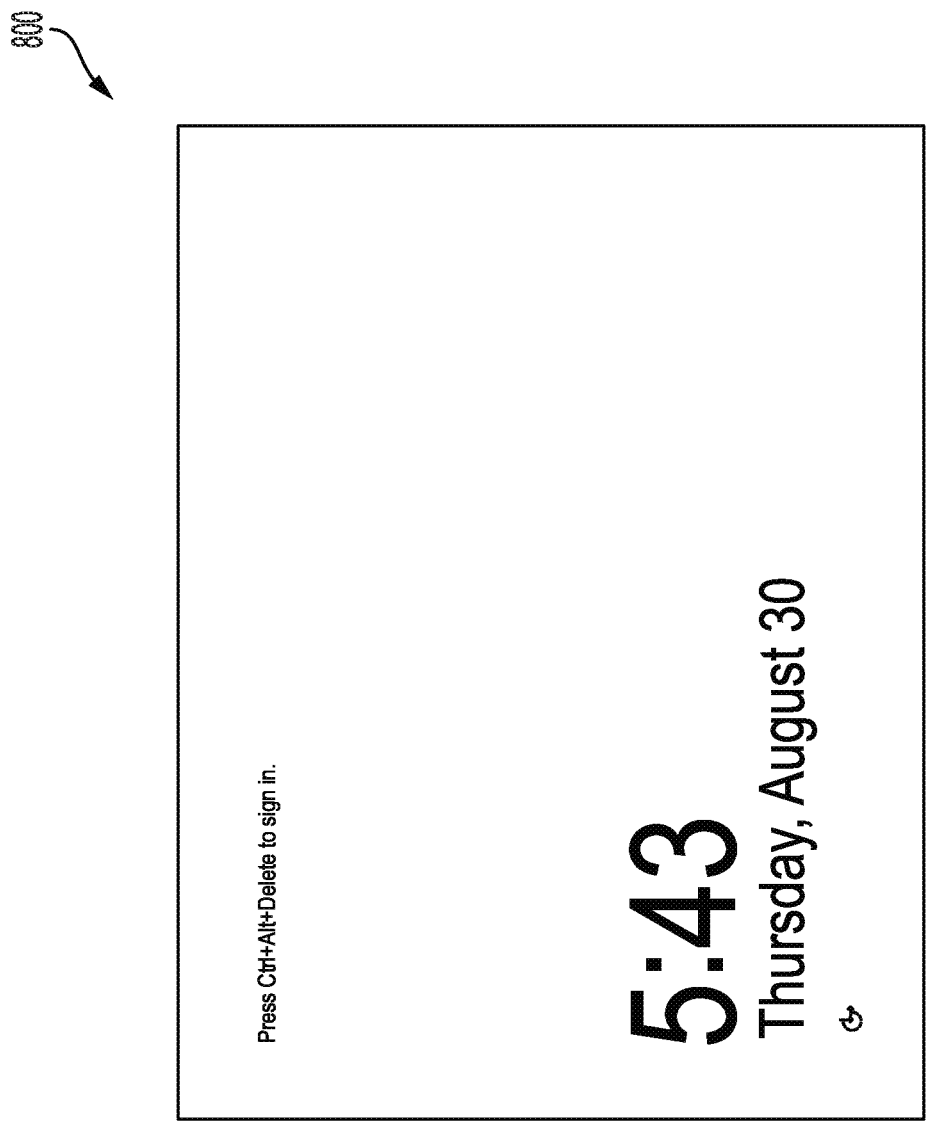
Figure 9:
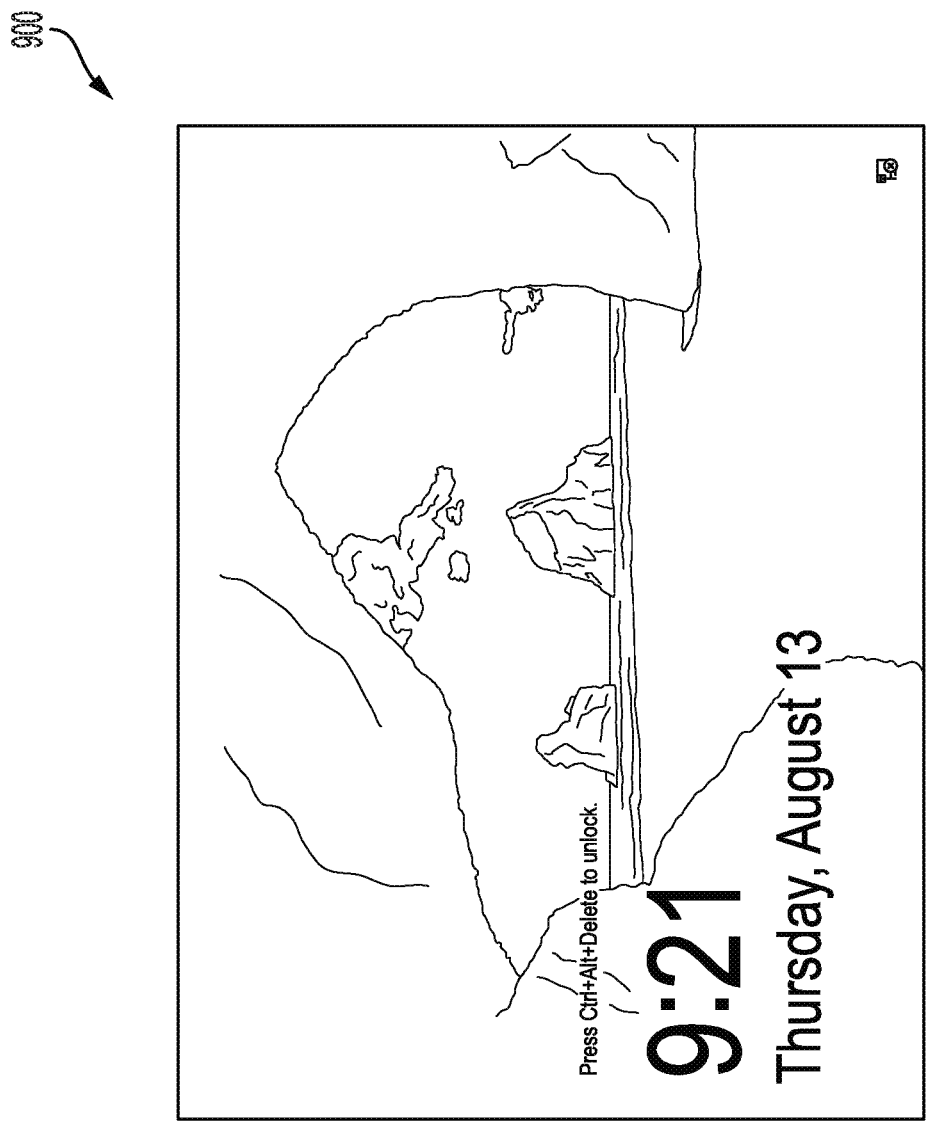

In a step 308, the plurality of samples taken may then be communicated, for example, to a screenshot verification server 116 for evaluation by a trained, computer vision model, where a state classification is determined based on at least one attribute associated with each sample of the plurality of samples. More specifically, the trained model can be an artificial neural network, such as a convolutional neural network, that is trained to determine at least one attribute associated with a screenshot of a virtual machine taken during the booting process. In particular embodiments, the state classification is an evaluation/prediction about whether the boot process was: (1) successful or "positive"; (2) unsuccessful or "negative"; or whether the boot process reached some other state. For example, and without limitation, the state classifications associated with login screens 600, 800, 900 (as shown in FIGS. 6, 8, and 9) may be determined as "positive", whereas the state classification associated with boot error screens 500, 700 (as shown in FIGS. 5 and 7) may be determined as "negative". Other boot screens may be determined as "neutral", indicating neither boot success nor boot failure, such as a "Getting Devices Ready" screen, while still further boot screens may be recorded as "special", such as a screenshot indicating updates are being performed. While FIGS. 5-9 illustrate screenshots of various boot states associated with a protected machine running Windows, the methods 300 disclosed herein are not limited to just Windows®, but may also be performed in conjunction with other operating systems, such as Unix, Linux, and the like. In such embodiments, the trained model may also be trained using boot screen images from multiple operating systems.

In a step 310, each sample of the plurality of samples of the VM and each state classification associated with the respective sample is added to a memory array 400. As shown in FIG. 4, each state classification and image sample are added to a memory array 400 and collectively tested for consistency. The image samples 402 are held with the state classifications so they can be provided to a user for verification. The array 400 may be a queue of fixed size L, where adding an item to the front drops the last item from the array. In particular embodiments, the size of the array 400 can be pre-determined and then as the method 300 runs, additional samples and state classifications are added to the array 400, thereby creating a running small window 404 (defined by window size $m_1$) of the state of the VM. In specific embodiments, the window size $m_1$ may be an integer between 1 and 10, including 1, 2, 3, 4, 5, 6, 7, 8, 9, and 10. As will also be appreciated, the number of samples 402 within each window 404, 406 also depends on the sampling rate $r_s$, and that both the period $m_1$ and rate $r_s$ may be adjusted to increase or decrease the testing window for boot state consistency. In other words, the sample rate $r_s$ and period $m_1$ may be variable and may be adjusted during each attempt to evaluate the integrity of the process-of-interest and/or boot state. For example, as shown in FIG. 4. the window 404 with window size $m_1$ encompasses 3 samples stored in the memory 400 while a subsequent window 406 defined by $m_2$ encompasses only 2 samples stored in the memory 400. Similarly, the sample rate $r_s$ may be variably adjusted during the determination of the consistency class such that even it window sizes $m_1$ and $m_2$ where the same, the number of samples 402 within each window may be different depending on the sample rate $r_s$. In particular embodiments, the sample rate $r_s$ can be about 1 sample per second, or at least 1 sample per second, or about 2 samples per second, or at least 2 samples per second, or about 5 samples per second, or at least 5 samples per second, or less than 1 sample per second, or about ½ samples per second, or about ⅓ samples per second, or about ¼ samples per second, or about ⅕ samples per second, or about ⅒ samples per second, or about ¹⁄₃₀ samples per second.

Returning to FIG. 3, in a step 312, the verification server 116 determines a consistency class based the sample images and state classifications within a certain window (e.g., the windows 404, 406 defined by $m_1$ and $m_2$). More specifically, one or more portions 404, 406 of the memory array 400 defined by periods $m_1$, $m_2$ are tested to determine whether the images and state classifications are consistent (i.e., unique) or different (i.e., not unique). In certain embodiments, at least a first portion and at least a second portion of the memory array 400 are tested to determine a consistency class, wherein the first portion may or may not overlap with the second portion.

In specific embodiments, the consistency class may be determined by converting the relevant portion(s) of the memory array 400 into a mathematical set, removing duplicate objects, and testing if the length is 1 (i.e., unique) or greater than 1 (i.e., not unique). In further embodiments, the previously remembered state classifications over L observations/samples may be returned instead of the consistency class, wherein L is an integer between about 1 and about 1000.

Figure 4:
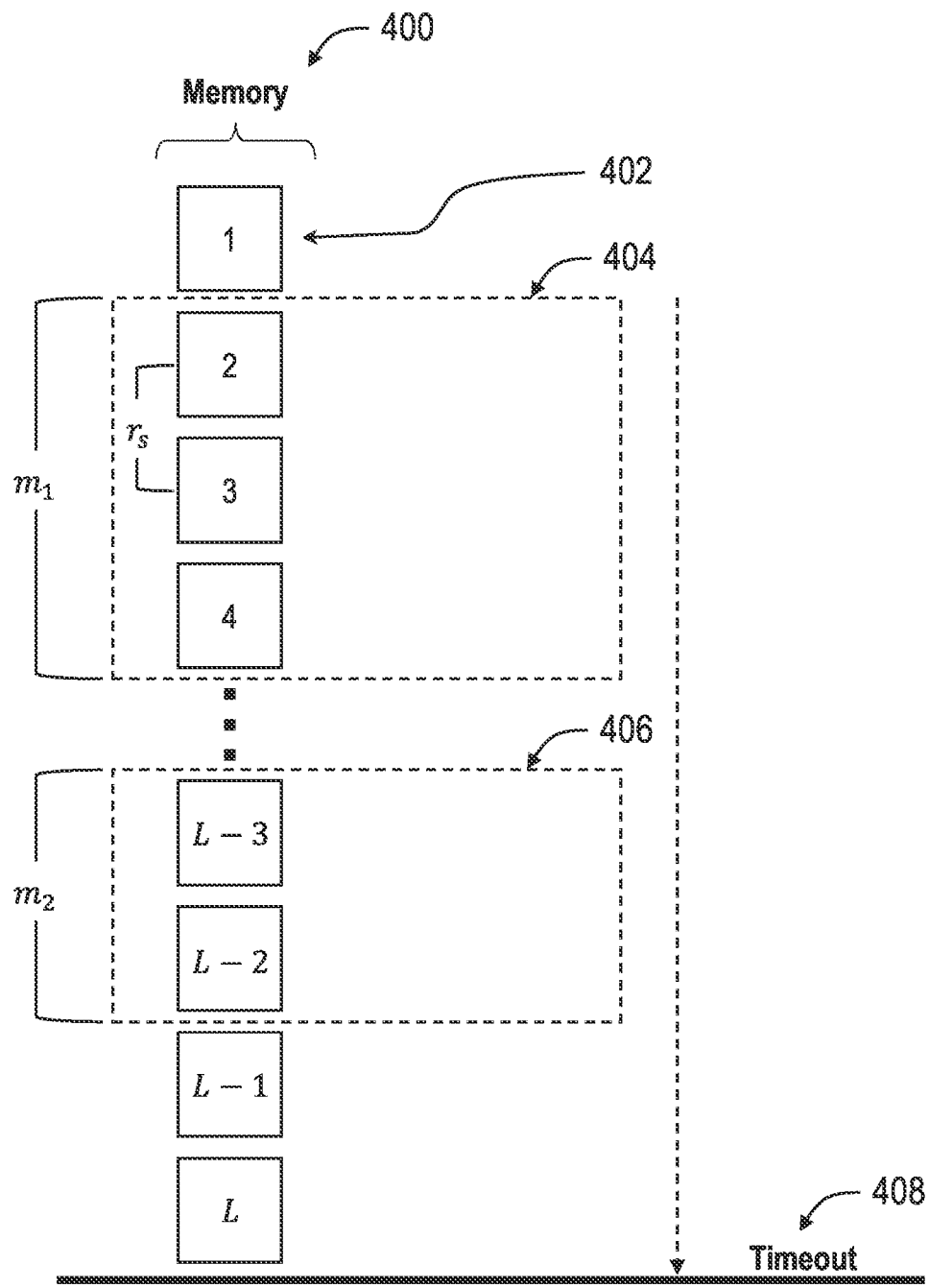
FIG. 4 is a block diagram illustrating the operation of a memory array used in the screenshot verification system in accordance with a further aspect of the present disclosure.

As illustrated by step 312, if the consistency class of the VM indicates that the process-of-interest/boot process has not reached a consistent state, the method 300 may repeat steps 306 through 312 until a consistent consistency class is determined or until a timeout duration (as shown in FIG. 4) is reached. For example, and without limitation, the timeout duration may be between about 100 seconds and about 500 seconds, or between about 250 seconds and about 350 seconds, or about 300 seconds, or less than about 10 minutes, or about 60 minutes. In such instances, the determined consistency class may be evaluated as inconsistent or indeterminate.

However, as illustrated by step 312, if the consistency class is determined to be consistent, the method 300 may include one or more further steps 314, 316, 318 based on the particular consistency class. For example, a consistency class can be determined when a subset of the memory array 400 having a sample period $m_1$, $m_2$ has a common state classification associated with one or more samples of the plurality of samples across the entire sample period $m_1$, $m_2$. In specific embodiments, the consistency class may be at least one of the following: consistent positive; consistent negative; consistent neutral; or consistent informational.

In particular embodiments, if the consistency class is determined to be consistent negative or consistent positive, the verification server 116 may report the boot failure 314 or the boot success 316, respectively. In some embodiments, if the consistency class is determined to be consistent neutral, then the method 200 may repeat steps 306 through 312 until a consistent positive or consistent negative is determined, or until the timeout duration is reached. Similarly, in further embodiments, if the consistency class is determined to be consistent informational, then the method 300 may include a step 318 of recording the information associated with the boot state (e.g., the attribute(s), state classifications, and/or screenshots) before repeating steps 306 through 312.

The report steps 314, 316, 318 may further include updating an associated system (such as a backup system 100) within information representative of the determined consistency class. For example, with reference to FIG. 10A, a backup agent dashboard 1010 is shown that includes a screenshot verification associated with a particular backup image of a protected machine. The backup agent dashboard 1010 further offers the user and/or technician a representative screenshot associated with the determined consistency class that corresponds to that backup image. As a result, the end-user may use the screenshot verification to determine whether to select a particular restore point (as shown in dashboard screen 1020 of FIG. 10B). However, the screenshot verification can also notify and enable technicians and image backup providers to verify the integrity of one or more backup images, automatically detect potential issues, and provide proactive recommendations and support to users of the protected machines. As described herein, the systems and methods for verifying the integrity of a backup image are at least 99% accurate in determining the correct consistency class.

Disclosed herein are exemplary embodiments including, but not limited to, the following:

[A1]. A method of evaluating the integrity of a process-of-interest associated with a protected machine, the method comprising: (a) initiating, via an operating system managing the protected machine, the process-of-interest; (b) taking, via the operating system managing the protected machine, a plurality of screenshots of the display output while the process-of-interest is being initiated; (c) communicating one or more of the plurality of screenshots of the display output to a prediction module; (d) using the prediction module, determining a state classification for each screenshot of the plurality of screenshots of the display output using a trained model, wherein the trained model is an artificial neural network; (e) adding each screenshot of the plurality of screenshots of the display output and the state classification associated with each screenshot to a memory array; (f) testing at least a first portion of the memory array to determine a consistency class for the process-of-interest based on the screenshots and the associated state classifications stored in at least the first portion of the memory array; (g) based on the consistency class determined based on at least the first portion of the memory array, performing at least one of the following: (g1) repeating steps (b) through (g) and testing at least a second portion of the memory array to determine a consistency class for the process-of-interest based on the screenshots and the associated state classifications stored in at least the second portion of the memory array, and wherein the second portion of the memory array includes one or more screenshots and one or more state classifications not included in the first portion of the memory array; and (g2) generating a report concerning the consistency class determined in connection with at least the first portion of the memory array, the report comprising a representative screenshot selected from the screenshots stored within the memory array and the consistency class.

[A2]. The method [A1], wherein the method further comprises: (h) generating a recommended action to be taken based on the consistency class; and (i) taking the recommended action, wherein the recommended action is taken by at least one of: the protected machine; and a device remote from the protected machine.

[A3]. The method of [A1] or [A2], wherein the one or more screenshots of the display output are communicated via a network protocol to the prediction module, the prediction module being located on a remote screenshot verification server, and one or more of steps (d) through (g) are performed by at least one processor of the screenshot verification server based on instructions for performing those steps stored in a memory of the screenshot verification server.

[A4]. The method of [A3], wherein one or more of steps (c) through (g) are performed by at least one processor of the protected machine based on instructions for performing those steps stored in a memory of the protected machine.

[A5]. The method of [A1], wherein the state classification determined in association with each screenshot of the plurality of screenshots is at least one of: positive; informational; neutral; and negative.

[A6]. The method of [A5], wherein at least the first portion of the memory array has a sample period $m_1$ and is tested to determine the consistency class by determining whether the first portion of the memory array has a common state classification associated with the one or more screenshots of the plurality of screenshots of the display output across the first portion of the memory array, wherein $m_1$ is an integer between 2 and 1000.

[A7]. The method of [A6], wherein the second portion of the memory array has a sample period $m_2$ and is tested to determine the consistency class based on the second portion of the memory array by determining whether the second portion of the memory array has a common state classification associated with the one or more screenshots stored in the memory array across at least the second portion of the memory array, wherein $m_2$ is an integer between 2 and 1000.

[A8]. The method of [A7], wherein the second portion of the memory array includes one or more screenshots and one or more state classifications not included in the first portion of the memory array.

[A9]. The method of [A6], wherein the consistency class is at least one of: consistent positive; consistent negative; consistent neutral; and consistent informational.

[A10]. The method of [A7], wherein the method further comprises: (g3) repeating steps (b) through (g) one or more times until a timeout duration is reached.

[A11]. The method of [A2], wherein the action taken includes at least one of: reporting information regarding the consistency class; recording information regarding the consistency class; and ending the method.

[B1]. A method of evaluating the integrity of at least a first backup image associated with a protected machine, the method comprising: (a) booting, via an operating system managing a first device, a virtual machine based on at least the first backup image; (b) taking, via the operating system managing the first device, a plurality of samples of the display output of the virtual machine over a first duration; (c)

communicating the plurality of samples to a prediction module located on a second device, the prediction module comprising a trained model; (d) determining, via the trained model of the prediction module, a state classification for one or more samples of the plurality of samples, wherein the trained model is an artificial neural network trained using a plurality of training images from one or more operating systems; (e) adding each sample of the plurality of samples and each associated state classifications to a memory array; (f) testing at least a first portion of the memory array to determine a consistency class based on the samples and the state classifications stored in at least the first portion of the memory array; (g) based on the consistency class determined based on at least the first portion of the memory array, performing at least one of the following: (g1) repeating steps (b) through (g) and testing at least a second portion of the memory array to determine a consistency class based on the samples and state classifications stored in at least the second portion of the memory array, wherein the second portion of the memory array includes one or more samples and one or more state classifications not included in the first portion of the memory array; and (g2) generating a report concerning the consistency class determined in connection with at least the first portion of the memory array, the report comprising a representative screenshot selected from the screenshots stored within the memory array and the consistency class.

[B2]. The method of [B1], wherein the method further comprises: (h) generating a recommended action to be taken based on the consistency class; and (i) taking the recommended action, wherein the recommended action is taken by at least one of the first device and the second device.

[B3]. The method of [B2], wherein one or more of steps (d) through (i) are performed by at least one processor of the second device based on instructions for performing those steps stored in a memory of the second device.

[B4]. The method of [B2], wherein the first device is the protected machine, and the second device is a screenshot verification server located remotely from the protected machine.

[B5]. The method of [B2], wherein the first device is a remote storage server that is storing the backup image associated with the protected machine, and the second device is a screenshot verification server located remotely from the protected machine and the remote storage server.

[B6]. The method of [B2], wherein the first device and the second device are the same device and are located remotely from the protected machine.

[B7]. The method of [B2], wherein the state classification determined for each sample of the plurality of samples is at least one of: positive; informational; neutral; and negative.

[B8]. The method of [B7], wherein at least the first portion of the memory array has a sample period $m_1$ and is tested to determine the consistency class by determining whether the first portion of the memory array has a common state classification associated with the one or more samples of the plurality of samples of the virtual machine across the first portion of the memory array, wherein $m_1$ is an integer between 2 and 1000.

[B9]. The method of [B8], wherein the second portion of the memory array has a sample period $m_2$ and is tested to determine the consistency class based on the second portion of the memory array by determining whether the second portion of the memory array has a common state classification associated with the one or more samples of the plurality of samples of the virtual machine stored in the memory array across the sample period $m_2$, wherein $m_2$ is an integer between 2 and 1000.

[B10]. The method of B9, wherein at least the second portion of the memory array includes one or more samples and one or more state classifications not included in the first portion of the memory array.

[B11]. The method of B1, wherein the consistency class is at least one of: consistent positive; consistent negative; consistent neutral; and consistent informational.

[B12]. The method of B1, wherein the method further comprises: (g3) repeating steps (b) through (g) one or more times until a timeout duration is reached.

[B13]. The method of B2, wherein the recommended action includes at least one of: reporting information regarding the consistency class; recording information regarding the consistency class; and ending the method.

[C1]. A backup system comprising: a first device including at least one processor and memory including instructions that, when executed by the at least one processor, cause the first device to perform one or more of the following steps: (a) booting a virtual machine based on at least a first backup image; (b) taking a plurality of samples of the display output of the virtual machine over a first duration while the virtual machine is booting; (c) communicating the plurality of samples of the virtual machine to a prediction module comprising a trained model, wherein the trained model is an artificial neural network trained using a plurality of boot-state training images from one or more operating systems; (d) determining, via the prediction model, a state classification for each sample of the plurality of samples of the virtual machine; (e) adding each sample of the plurality of samples of the virtual machine and the state classification determined in association with each sample to a memory array; (f) testing at least a first portion of the memory array to determine a consistency class based on the samples and the state classifications stored in at least the first portion of the memory array; and (g) based on the consistency class determined based on at least the first portion of the memory array, performing at least one of the following: (g1) repeating steps (b) through (g) and testing at least a second portion of the memory array to determine a consistency class based on the samples and state classifications stored in at least the second portion of the memory array, wherein the second portion of the memory array includes one or more samples and one or more state classifications not included in the first portion of the memory array; (g2) generating a report concerning the consistency class determined in connection with at least the first portion of the memory array, the report comprising a representative screenshot selected from the screenshots stored within the memory array and the consistency class; and (g3) generating a recommended action to be taken based on the consistency class and taking the recommended action, wherein the recommended action including at least one of: reporting information regarding the consistency class; recording information regarding the consistency class; and ending the method.

[C2]. The system of [C1], wherein the system further comprises a second device including at least one processor and memory including instructions that, when executed by the at least one processor, cause the second device to perform one or more of steps (a) through (g).

[C4]. The system of [C2], wherein the first device is at least one of: a protected machine; a screenshot verification server; and a remote storage server.

[C5]. The system of [C4], wherein the second device is at least one of: a protected machine; a screenshot verification server; and a remote storage server.

[C6]. The system of [C5], wherein the first device is a protected machine and the second device is a screenshot verification server, the screenshot verification server being located at a cloud storage center remote from the protected machine.

[C7]. The system of [C1], wherein the state classification associated with each sample of the plurality of samples is at least one of: positive; informational; neutral; and negative.

[C8]. The system of [C1], wherein at least the first portion of the memory array has a sample period $m_1$ and is tested to determine the consistency class by determining whether the first portion of the memory array has a common state classification associated with the one or more samples of the plurality of samples of the virtual machine across the first portion of the memory array, wherein $m_1$ is an integer between 2 and 1000.

[C9]. The system of [C1], wherein at least the second portion of the memory array has a sample period $m_2$ and is tested to determine the consistency class based on the second portion of the memory array by determining whether the second portion of the memory array has a common state classification associated with the one or more samples of the plurality of samples of the virtual machine stored in the memory array across the sample period $m_2$, wherein $m_2$ is an integer between 2 and 1000.

[C10]. The system of [C8], wherein the consistency class is at least one of: consistent positive; consistent negative; consistent neutral; and consistent informational.

[D1]. A screenshot verification system for evaluating the integrity of a process-of-interest, the system comprising: a first device comprising at least one processor and memory including instructions that, when executed by the at least one processor, cause the first device to perform one or more of the following steps: (a) initializing the process-of-interest; (b) taking a plurality of screenshots of the display output associated with the process-of-interest over a first duration including the initialization of the process-of-interest; (c) communicating the plurality of screenshots of the display output associated with the process-of-interest to a prediction module, wherein the prediction comprises a trained model that is an artificial neural network trained using a plurality of process-of-interest training images from one or more operating systems; (d) determining, via the prediction module, a state classification for each screenshot of the plurality of screenshots of the display output associated with the process-of-interest; (e) adding each screenshot of the plurality of screenshots of the display output and the state classifications determined in association with each screenshot to a memory array; (f) testing at least a first portion of the memory array to determine a consistency class for the process-of-interest based on the screenshots and the associated state classifications stored in at least the first portion of the memory array; (g) based on the consistency class determined based on at least the first portion of the memory array, performing at least one of the following: (g1) repeating steps (b) through (g) and testing at least a second portion of the memory array to determine a consistency class for the process-of-interest based on the screenshots and the associated state classifications stored in at least the second portion of the memory array, and wherein the second portion of the memory array includes one or more screenshots and one or more state classifications not included in the first portion of the memory array; (g2) generating a report concerning the consistency class determined in connection with at least the first portion of the memory array, the report comprising a representative screenshot selected from the screenshots stored within the memory array and the consistency class; and (g3) generating a recommended action to be taken based on the consistency class and taking the recommended action, wherein the recommended action including at least one of: reporting information regarding the consistency class; recording information regarding the consistency class; and ending the method.

[D2]. The screenshot verification system of [D1], wherein the system further comprises a second device including at least one processor and memory including instructions that, when executed by the at least one processor, cause the second device to perform one or more of steps (a) through (g).

[D3]. The system of [D2], wherein the first device is at least one of: a protected machine; a screenshot verification server; and a remote storage server.

[D4]. The system of [D3], wherein the second device is at least one of: a protected machine; a screenshot verification server; and a remote storage server.

[D5]. The system of [D2], wherein the state classification determined in association with each screenshot of the plurality of screenshots is at least one of: positive; informational; neutral; and negative.

[D6]. The system of [D2], wherein at least the first portion of the memory array has a sample period $m_1$ and is tested to determine the consistency class by determining whether the first portion of the memory array has a common state classification associated with the one or more samples of the plurality of samples of the virtual machine across the first portion of the memory array, wherein $m_1$ is an integer between 2 and 1000.

[D7]. The system of [D3], wherein at least the second portion of the memory array has a sample period $m_2$ and is tested to determine the consistency class based on the second portion of the memory array by determining whether the second portion of the memory array has a common state classification associated with the one or more samples of the plurality of samples of the virtual machine stored in the memory array across the sample period $m_2$, wherein $m_2$ is an integer between 2 and 1000.

[D8]. The system of [D7], wherein at least the second portion of the memory array includes one or more screenshots and one or more state classifications not included in the first portion of the memory array.

[D9]. The system of [D1], wherein the consistency class is at least one of: consistent positive; consistent negative; consistent neutral; and consistent informational.

[D10]. The system of [D4], wherein the first device is a protected machine and the second device is a screenshot verification server that is located at a cloud storage center remote from the protected machine.

[D11]. The system of [D4], wherein the first device is a protected machine and is configured to perform each of steps (a) through (g).

[D12]. The system of [D10], wherein at least steps (a) through (c) are performed via the first device, at least steps (d) through (g) are performed via the second device, and the plurality of screenshots of the display output associated with the process-of-interest is communicated via a network interface to the second device from the first device.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulation of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the above discussion, it is appreciated that throughout the description, discussions utilizing terms such as "identifying" or "determining" or "encoding" or "performing" or "dividing" or "setting" or "adding" or "locating" or "copying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage devices.

The present disclosure also relates to an apparatus for performing the operations herein. This apparatus may be specially constructed for the intended purposes, or it may comprise a general purpose computer selectively activated or reconfigured by a computer program stored in the computer. Such a computer program may be stored in a computer readable storage medium, such as, but not limited to, any type of disk including floppy disks, optical disks, CD-ROMs, and magnetic-optical disks, read-only memories (ROMs), random access memories (RAMs), EPROMS, EEPROMs, magnetic or optical cards, or any type of media suitable for storing electronic instructions, each coupled to a computer system bus.

The algorithms and displays presented herein are not inherently related to any particular computer or other apparatus. Various general purpose systems may be used with programs in accordance with the teachings herein, or it may prove convenient to construct a more specialized apparatus to perform the method. The structure for a variety of these systems will appear as set forth in the description below. In addition, the present disclosure is not described with reference to any particular programming language. It will be appreciated that a variety of programming languages may be used to implement the teachings of the disclosure as described herein.

The present disclosure may be provided as a computer program product, or software, that may include a machine-readable medium having stored thereon instructions, which may be used to program a computer system (or other electronic devices) to perform a process according to the present disclosure. A machine-readable medium includes any mechanism for storing information in a form readable by a machine (e.g., a computer). For example, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing specification, implementations of the disclosure have been described with reference to specific example implementations thereof. It will be evident that various modifications may be made thereto without departing from the broader spirit and scope of implementations of the disclosure as set forth in the following claims. The specification and drawings are, accordingly, to be regarded in an illustrative sense rather than a restrictive sense.

What is claimed is:

1. A method of evaluating integrity of a process-of-interest associated with a protected machine, the method comprising:

initiating, via an operating system managing the protected machine, the process-of-interest;

taking, via the operating system managing the protected machine, a plurality of screenshots of a display output while the process-of-interest is being initiated;

determining a state classification for each screenshot of the plurality of screenshots of the display output using a trained model, based on one or more determined attributes associated with each screenshot of the plurality of screenshots, wherein the trained model is an artificial neural network;

adding each screenshot of the plurality of screenshots of the display output and the state classification associated with each screenshot to a memory array;

testing at least a first portion of the memory array to determine a consistency class for the process-of-interest based on screenshots and the associated state classifications stored in at least the first portion of the memory array, wherein the consistency class represents a steady state classification over a particular period of time; and performing one or more operations based on result of the testing.

2. The method of claim 1, wherein the one or more operations include:

in response to the consistency class not being determined, collecting one or more additional screenshots;

adding the one or more additional screenshots to a second portion of the memory array; and testing at least the second portion of the memory array to determine the consistency class for the process-of-interest.

3. The method of claim 1, wherein the one or more operations include generating a report concerning the consistency class determined in connection with at least the first portion of the memory array, the report comprising a representative screenshot selected from the screenshots stored within the memory array and the consistency class.

4. The method of claim 1, wherein the associated state classifications determined in association with each screenshot of the plurality of screenshots is at least one of: positive; informational; neutral; and negative.

5. The method of claim 4, wherein at least the first portion of the memory array has a sample period $m_1$ and is tested to determine the consistency class by determining whether the first portion of the memory array has a common state classification associated with the one or more screenshots of the plurality of screenshots of the display output across the first portion of the memory array, wherein $m_1$ is an integer between 2 and 1000.

6. A method of evaluating integrity of at least a first backup image associated with a protected machine, the method comprising:

booting, via an operating system managing a first device, a virtual machine based on at least the first backup image;

taking, via the operating system managing the first device, a plurality of samples of display output of the virtual machine over a first duration;

determining, via a trained model of a prediction module, state classifications for one or more samples of the plurality of samples, based on one or more determined attributes associated with the one or more samples of the plurality of samples, wherein the trained model is an artificial neural network trained using a plurality of training images from one or more operating systems;

adding each sample of the plurality of samples and each associated state classifications to a first portion of a memory array; and determining whether a consistency class is reached based on the plurality of samples added in the first portion of the memory array and the state classifications stored in the memory array, wherein the consistency class represents a steady state classification over a particular period of time.

7. The method of claim 6, wherein the prediction module is located on a second device, the plurality of samples being communicated from the first device to the second device.

8. The method of claim 7, the method further comprising:
generating a recommended action to be taken based on the consistency class; and
taking the recommended action, wherein the recommended action is taken by at least one of the first device and the second device.

9. The method of claim 8, wherein the recommended action includes at least one of: reporting information regarding the consistency class; recording information regarding the consistency class; and ending the method.

10. The method of claim 7, wherein the first device is the protected machine, and the second device is a screenshot verification server located remotely from the protected machine.

11. The method of claim 7, wherein the first device is a remote storage server that is storing a backup image associated with the protected machine, and the second device is a screenshot verification server located remotely from the protected machine and the remote storage server.

12. The method of claim 7, wherein the first device and the second device are the same device and are located remotely from the protected machine.

13. The method of claim 6, wherein the state classification determined for each sample of the plurality of samples is at least one of: positive; informational; neutral; and negative.

14. The method of claim 6, further comprising:
in response to determining that a consistent class is not reached:
collecting one or more additional screenshots;
adding the one or more additional screenshots to a second portion of the memory array;
testing at least the second portion of the memory array to determine the consistency class; and
repeating steps above one or more times until the consistency class is determined or a timeout duration is reached.

15. The method of claim 14, wherein at least the first portion of the memory array has a sample period $m_1$ and is tested to determine the consistency class by determining whether the first portion of the memory array has a common state classification associated with the one or more samples of the plurality of samples of the virtual machine across the first portion of the memory array, wherein $m_1$ is an integer between 2 and 1000.

16. The method of claim 15, wherein the second portion of the memory array has a sample period $m_2$ and is tested to determine the consistency class based on the second portion of the memory array by determining whether the second portion of the memory array has a common state classification associated with the one or more samples of the plurality of samples of the virtual machine stored in the memory array across the sample period $m_2$, wherein $m_2$ is an integer between 2 and 1000.

17. The method of claim 16, wherein at least the second portion of the memory array includes one or more samples and one or more state classifications not included in the first portion of the memory array.

18. The method of claim 6, wherein the consistency class is at least one of: consistent positive; consistent negative; consistent neutral; and consistent informational.

19. A backup system comprising: a first device including at least one processor and memory including instructions that, when executed by the at least one processor, cause the first device to perform one or more of the following steps:

(a) obtaining a plurality of samples of display output of a virtual machine, booted based on at least a first backup image, over a first duration;

(b) communicating the plurality of samples to a prediction module comprising a trained model, wherein the trained model is an artificial neural network trained using a plurality of boot-state training images from one or more operating systems;

(c) determining, via the prediction module, state classifications for each sample of the plurality of samples of the virtual machine, based on one or more determined attributes associated with the one or more samples of the plurality of samples;

(d) adding each sample of the plurality of samples of the virtual machine and the state classifications determined in association with each sample to a memory array;

(e) testing at least a first portion of the memory array to determine a consistency class based on the plurality of samples and the state classifications stored in at least the first portion of the memory array, wherein the consistency class represents a steady state classification over a particular period of time; and performing one or more operations based on the consistency class.

20. The backup system of claim 19, wherein the operations include:

repeating steps (b) through (e) and testing at least a second portion of the memory array to determine a consistency class based on the plurality of samples and state classifications stored in at least the second portion of the memory array, wherein the second portion of the memory array includes one or more samples and one or more state classifications not included in the first portion of the memory array;

generating a report concerning the consistency class determined in connection with at least the first portion of the memory array, the report comprising a representative sample selected from the plurality of samples stored within the memory array and the consistency class; and generating a recommended action to be taken based on the consistency class and taking the recommended action, wherein the recommended action including at least one of: reporting information regarding the consistency class; recording information regarding the consistency class; and terminating operations.

* * * * *